United States Patent [19]

Erickson

[11] Patent Number: 4,683,445

[45] Date of Patent: Jul. 28, 1987

[54] SYNCHRONIZATION METHOD FOR DERIVING A REFERENCE SIGNAL FROM A PILOT FREQUENCY

[75] Inventor: Paul M. Erickson, Hanover Park, Ill.

[73] Assignee: Motorola Inc., Schaumburg, Ill.

[21] Appl. No.: 858,323

[22] Filed: Apr. 30, 1986

[51] Int. Cl.$^4$ .............................................. H03L 7/00
[52] U.S. Cl. ........................................ 331/25; 331/17
[58] Field of Search ................... 331/1 R, 17, 18, 25; 329/122; 328/133, 155

[56] References Cited

U.S. PATENT DOCUMENTS

| | | | |
|---|---|---|---|
| 3,983,498 | 9/1976 | Malek | 328/155 |
| 4,117,410 | 9/1978 | Bender | 329/50 |
| 4,156,204 | 5/1979 | Hargis | 331/12 |
| 4,313,089 | 1/1982 | Predina | 328/155 |
| 4,390,845 | 6/1983 | Strickland | 329/103 |
| 4,418,318 | 11/1983 | Swagerty et al. | 331/25 X |

Primary Examiner—Eugene R. LaRoche
Assistant Examiner—Robert J. Pascal
Attorney, Agent, or Firm—Edward M. Roney; Donald B. Southard

[57] ABSTRACT

An improved synchronization method and apparatus is disclosed which derives a common reference signal from a pilot frequency which is embedded among other signal information and which may be preselected from among a group of possible pilot frequencies utilized in multiplexing and demultiplexing groups of information signals on a RF communication system. One such arrangement as disclosed provides for rapid phase-lock acquisition with very few functional blocks by utilizing a linear multiplier as a phase detector at the generally higher pilot frequency rather than the much lower reference frequency. Another embodiment discloses a method and arrangement for providing automatic leveling of the pilot frequency input signal using a second linear multiplier as an amplitude detector. By definition, the first linear multiplier requires the injection signal to be in phase-quadrature with the inputted pilot frequency, while the second linear multiplier requires its injection signal to be in phase with the pilot frequency input signal in order to develop a signal output proportional to the signal level of the pilot frequency input signal. These arrangements are able to provide rapid locking capability without tedious hardware changes being made to the synchronization stages.

24 Claims, 4 Drawing Figures

SYNCHRONIZATION METHOD FOR DERIVING A REFERENCE SIGNAL FROM A PILOT FREQUENCY

BACKGROUND OF THE INVENTION

The present invention relates generally to synchronization methods and more particularly to an improved method and arrangement for deriving a reference signal from a pilot frequency utilizing phase-locked loop techniques. This arrangement is able to derive a common reference frequency from one of several preestablished pilot frequencies which are normally transmitted along with information signals on a microwave RF communications system.

Today's microwave communications systems are able to make efficient use of the crowded radio spectrum by combining a group of channels containing information signals onto a very high RF carrier utilizing multiplexing techniques. Such multiplex techniques depend on a synchronization signal which is transmitted along with this group of channels, and which is received and decoded for demultiplexing these groups of channels. This multiplexing process generally depends on a pilot frequency, such as 60, 64, 308, 512, or 564 KHz, being transmitted with the group of multiplexed channels over a microwave system. While such systems may require one or more pilot frequencies to be utilized, equipment design constraints necessarily dictate a common reference signal be derived from each of these possible pilot frequencies. Thus, the synchronization method and apparatus at the receivers in the microwave system is expected to acquire and maintain an internal reference frequency having high stability. Furthermore, the synchronization method and apparatus utilized to derive this reference frequency should provide an easily programmable method to select one of the possible pilot frequencies to be utilized on the system without having to remove and replace expensive crystal filters or other delicate hardware components.

Certain techniques are known which have provided synchronization capability to lock to a given pilot frequency and derive a reference signal. Such techniques generally utilize a voltage controlled crystal oscillator synchronized by a phase-lock loop to derive a reference frequency. These arrangements may also include additional circuit elements to provide a pilot frequency for providing master/slave capability.

One known method utilizes a voltage controlled crystal oscillator phase-lock loop to derive the reference signal. This phase-lock loop (PLL) is synchronized to a programmable synthesizer which reconstructs and locally generates the pilot frequency. This programmable synthesizer in turn is synchronized by the inputted pilot frequency which has first been filtered by a high selectivity crystal bandpass filter. While such an arrangement is suitable for some system designs, it nevertheless suffers from a serious drawback. This drawback is that the narrowband crystal filter must be specifically chosen for the particular pilot frequency being used. Thus, although the programmable synthesizer permits the circuit to be synchronized to a different pilot frequency while maintaining the same reference frequency output, a technician must specifically remove and replace the crystal bandpass filter to effect a change in pilot frequency.

A second known arrangement utilizes three overlapping and intertwined phase-locked loops to derive a common reference frequency from one of a group of possible pilot frequencies. This arrangement utilizes a voltage controlled crystal oscillator (VCXO) to drive a number of fixed dividers in order to derive the reference frequency. This VCXO with dividers drives a digital phase detector operating at the reference frequency and also develops the injection signal for down-converting the inputted pilot frequency to an intermediate frequency (IF). This IF is comparable in value to the common reference signal to be derived. While such an arrangement is suitable for some system designs, it nevertheless suffers from increased complexity and relatively slow phase-lock acquisition capability, due to the digital phase detector operating at the reference frequency. Thus each of these arrangements has serious limitations unique to the structure itself. Moreover, both of these methods and arrangements have the additional disadvantage of requiring the input level of the pilot frequency to fall within a narrow operating range.

Accordingly, there exists a need for an improved synchronization method and apparatus which is able to be easily programmed to select a given pilot frequency and derive a common reference signal. This method and arrangement should allow rapid lock acquisition capability while minimizing the complexity and number of elements used overall, as well as eliminating hardware changes.

SUMMARY OF THE INVENTION

It is an object of the present invention to provide an improved synchronization apparatus capable of deriving a stable reference signal from a selected pilot frequency with a minimal amount of hardware and which overcomes the foregoing deficiencies.

It is a further object of the present invention to provide an improved synchronization apparatus of the foregoing type having a wide dynamic range input capability as well as ease of selection of a given pilot frequency from a group of possible pilot frequencies and which eliminates the need for expensive narrow band crystal filters.

In practicing the invention, a synchronization arrangement is provided which includes a voltage controlled oscillator generating an output signal which, in the simplest form of the present invention, drives a frequency synthesizer operating as a programmable multiplier for developing an injection signal. This injection signal drives a first input of a linear multiplier used as a phase detector having the inputted information signals including the pilot frequency applied to its second input. The linear multiplier develops a control signal at base band to provide a correction signal to the voltage controlled oscillator (VCO). The inputted signals to the linear multiplier may first pass through an optional bandpass filter which need only provide a small amount of selectivity for one or more of the pilot frequencies. With the VCO generating the output signal as the first harmonic of the desired reference frequency, the simplest form of the present invention derives the reference frequency from a selected pilot frequency according to the preset factor of the programmable multiplier. This preset factor is established by the multiplying phase-lock loop frequency synthesizer. In an alternate embodiment of the present invention, where a voltage controlled crystal oscillator (VCXO) may be required for improved stability, the present invention contemplates the use of a fixed divider at its output in order to permit the VCXO to operate at a higher harmonic of the reference frequency.

In the preferred embodiment of the present invention, the synchronization arrangement is shown with a VCXO and fixed divider, and includes a leveling arrangement ahead of the synchronization apparatus to provide automatic leveling of the inputted pilot frequency. By utilizing a linear multiplier as a detector to generate a negative feedback signal via a comparator and an integrator, this leveling arrangement is able to control a variable-gain amplifier according to a preset DC control voltage. The result of using either of these two synchronization apparatus systems in conjunction with the automatic leveling control is a simplified synchronization arrangement exhibiting rapid lock acquisition, wide, input dynamic range, and ease of selecting one of a group of possible pilot frequencies, such as 60, 64, 308, 512, or 564 KHz. Moreover, no expensive, narrow band crystal filters are required to implement the disclosed synchronization arrangement.

These and other objects of the present invention will become apparent to those skilled in the art upon consideration of the accompanying specification, claims, and drawings.

BRIEF DESCRIPTION OF THE DRAWINGS

Referring to the drawings, wherein like reference numerals indicate like elements in the several figures and in which.

DETAILED DESCRIPTION

Figure 1:
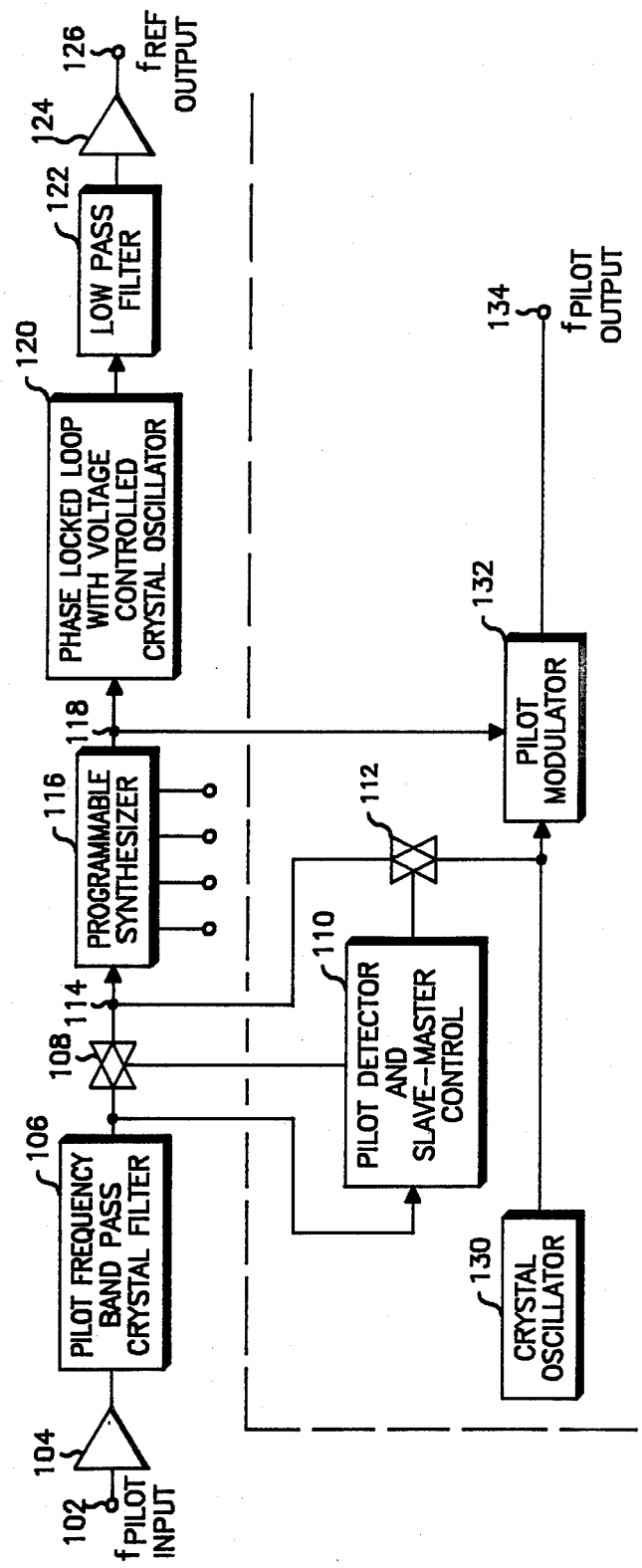
FIG. 1 is a block diagram diagram of a known arrangement for synchronizing an output reference frequency to an inputted pilot frequency.

Referring now to the drawings, a known method for deriving a reference signal from a pilot frequency is shown at 100 in FIG. 1. This arrangement consists of pilot frequency input port 102, driving an amplifier stage 104, which drives a narrow band crystal filter 106. The output of filter 106 then drives a bi-directional gate 108 as well as a pilot detector and slave/master control stage 110. Detector and controller 110 has one output controlling bi-directional gate 108 and another output controlling a second bi-directional gate 112, with the output from each bi-directional gate 108, 112, connected to a common node 114, which drives programmable synthesizer 116. The synthesizer 116 includes a number of programming input lines which determine the algebraic relationship of the frequency at its output with respect to the frequency provided by node 114 at its input. This output from synthesizer 116 proceeds via node 118 to a phase-lock loop containing a voltage controlled crystal oscillator 120 which exhibits a high degree of stability and whose output is passed to low pass filter stage 122 and output amplifier 124 to provide the recovered reference frequency output signal at port 126. Also shown in FIG. 1 is additional circuitry to reconstruct a locally generated or filtered version of the pilot frequency by means of crystal oscillator 130, driving not only bi-directional gate 112, but also a pilot modulator 132 in order to develop the pilot output frequency at port 134.

In operation, this prior art arrangement receives the inputted pilot frequency at port 102, filters the pilot frequency from the other signals adjacent to this pilot frequency which may include other information signals, and applies this filtered pilot frequency to programmable synthesizer 116. Programmable synthesizer 116 has a preestablished, built in multiplication factor which causes it to generate an output frequency of approximately 5.2 MHz, which is phase locked to the pilot frequency available at node 114. VCXO phase-lock loop stage 120 generates 5.2038235294 MHz when it is locked to a 5.2 MHz signal applied at node 118. Stage 120 also includes a divider, not shown, which divides by a factor of 1361 to provide a signal at 3823.5294 Hz. This signal is used for modem synchronization and will hereinafter be referred to as the reference frequency of approximately 4 KHz. Although this arrangement is able to provide the reference frequency at output 126, this method has the disadvantage, as previously discussed above, that the narrow band crystal filter 106 must be removed and replaced if the arrangement is to operate on a different pilot frequency inputted at port 102.

Figure 2:
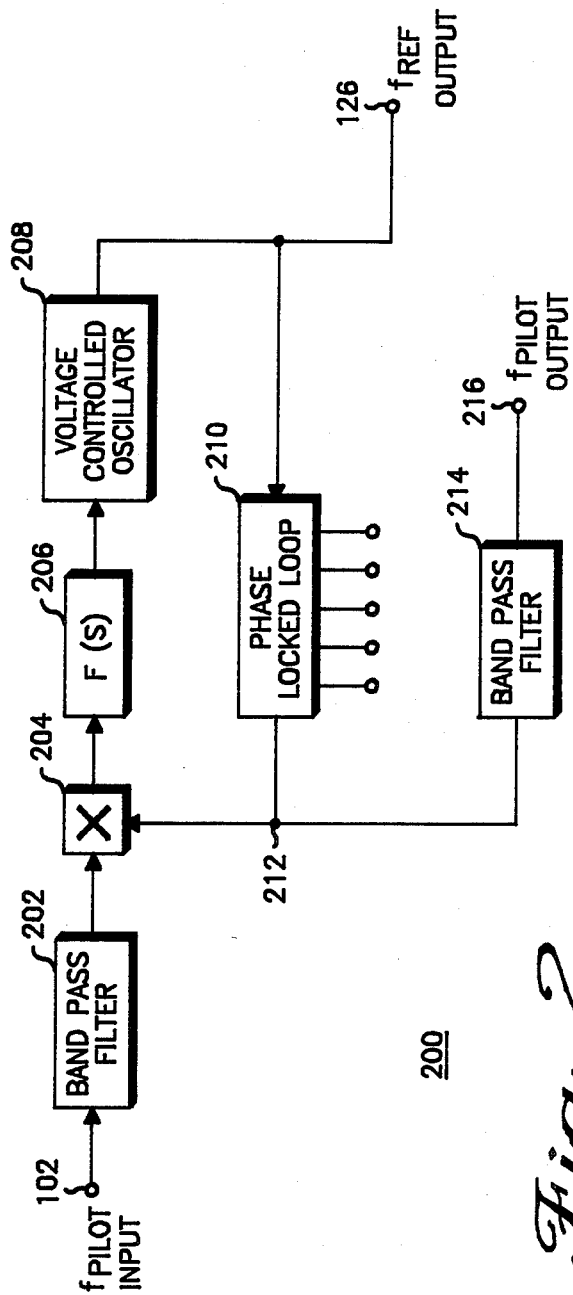
FIG. 2 is a block diagram of one embodiment of the present invention for synchronizing an output reference frequency to an inputted pilot frequency.

Turning now to FIG. 2, there is shown at 200 one embodiment of the present invention. Beginning with the pilot frequency input port 102, the pilot signal proceeds through optional bandpass filter 202 to linear phase detector 204, which generates a base band control signal having a DC component therein which is applied through loop filter 206 to a voltage controlled oscillator (VCO) 208. Loop filter 206 provides the alternate channel selectivity while utilizing simple lag, or lag-lead, components. VCO 208 provides the reference frequency output signal at port 126 and also feeds a programmable multiplier stage 210, which is a frequency multiplying phase-lock loop. The output of this programmable multiplier 210 drives node 212 with an injection frequency which is approximately equal to the pilot frequency and in phase-quadrature with it. Linear phase detector 204 permits phase accrual at the higher pilot frequency so as to rapidly phase detect and provide a base band control signal having a DC component. In addition, the injection frequency signal at node 212 may be passed through optional band pass filter 214 to drive pilot frequency output port 216.

In operation, the arrangement of FIG. 2 takes the received pilot frequency input via input port 102 and uses a simple bandpass filter 202 to provide a small amount of selectivity to adjacent channels. It is wide enough to permit several pilot frequencies, such as, for example, 60, and 64 KHz or 512, 564 KHz to pass through. Linear phase detector 204 may be a linear multiplier such as a dual differential transistor pair, available commercially as Motorola part No. MC1496, to provide the quadrature phase detector. Filter 206 is a loop filter such as a lag, or lag-lead filter, typically used to filter and control a VCO and a phase-lock loop. VCO 208 often times has loop filter 206 included on the same circuit board within the same module. Moreover, VCO 208 may include any suitable oscillator which outputs approximately the desired reference signal, here 4 KHz, and having a control signal input. Thus, this VCO could be implemented as a 4 KHz oscillator, or as a higher frequency oscillator having its own built-in frequency divider. Programmable phase-lock loop 210 is a typical one known in the art containing its own appropriate VCO having a loop filter and a sample of its output divided down by a suitable, programmable, variable divider back to a phase detector on its input utilizing this 4 KHz reference frequency as a standard to which it locks. So, in order to effect a change in pilot frequency and yet maintain the same reference output frequency, one merely changes the programming to the phase-lock loop 210 such that the injection frequency generated by phase-lock loop 210 equals approximately the new value of the pilot frequency to be inputted at port 102. Bandpass filter 202 is included to merely provide some selectivity to exclude certain other information signals unneeded by the synchronization loop shown here.

Figure 3:
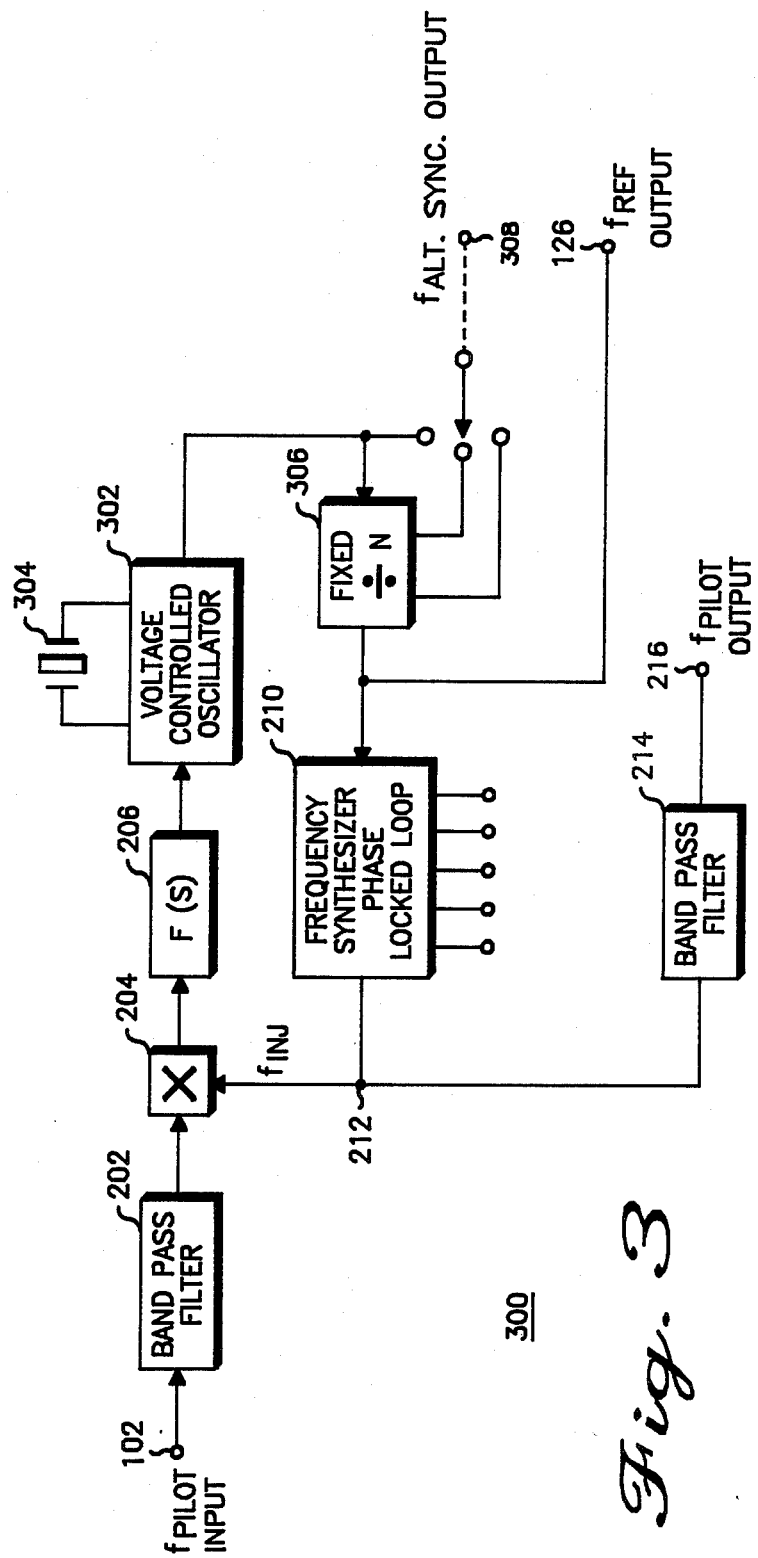
FIG. 3 is a block diagram of an alternate embodiment of the present invention utilizing a VCXO operating at a harmonic of the output reference frequency as determined by an included fixed divider.

Turning now to FIG. 3, alternate embodiment 300 is shown which is based upon the simplest form of the invention of FIG. 2. Here, the same input port 102, bandpass filter 202, linear phase detector 204, and loop filter 206 are shown. However, high frequency, high stability voltage controlled crystal oscillator (VXCO) 302 with crystal 304 is now included. Its output frequency, such as 5.2 MHz, is chosen to be a higher harmonic of the reference frequency desired at output 126. Thus, fixed divider 306 is interposed as shown to provide the 4 KHz reference output signal as previously provided. This signal is then fed to frequency synthesizer 210, which drives node 212 and supplies the injection frequency to linear phase detector 204. Optional bandpass filter 214, driving a pilot frequency output port 216, may also be provided. Therefore, this alternate embodiment exhibits very high frequency stability due to the fact that crystal 304 stabilizes the output frequency versus temperature performance of the arrangement. This embodiment also permits an alternate sync frequency, ranging between the VCXO and reference frequencies, to be outputted at 308.

Figure 4:
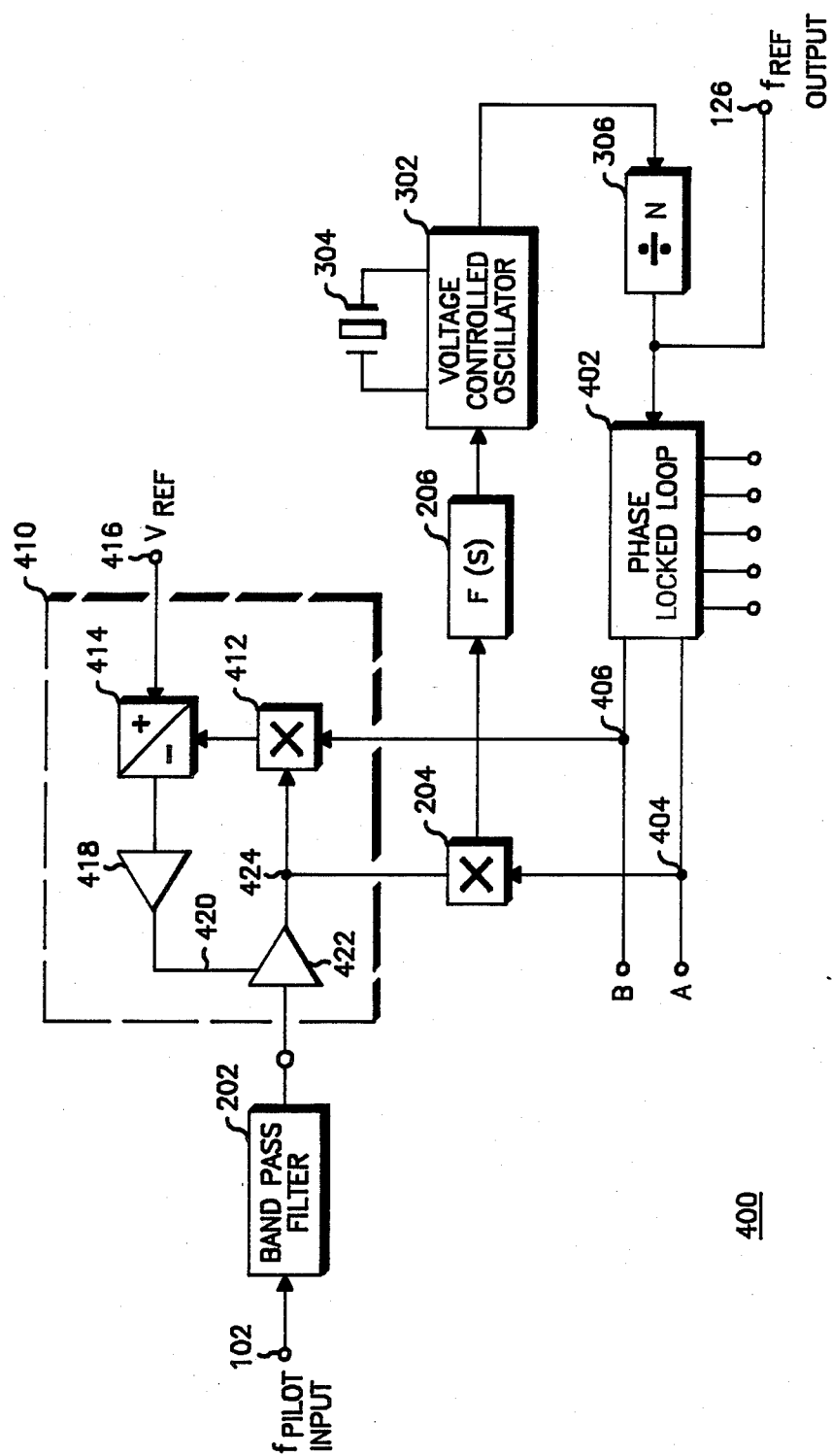
FIG. 4 is a block diagram of still another embodiment of the present invention, having a VCXO and fixed divider and also an automatic leveling circuit incorporated ahead of the synchronization circuitry.

Referring now to FIG. 4, still another embodiment of the present invention is shown at 400 and includes the VCXO described in FIG. 3 and also includes an automatic leveling circuit depicted at 410. First, the same pilot frequency input port 102 and the reference frequency output port 126 are shown. Note that here the programmable multiplier phase-lock loop 402 has been modified to have two outputs labeled A and B, and denoted by nodes 404 and 406, respectively. These two outputs from phase-lock loop 402 have the same injection frequency output, but the two signals are in phase-quadrature with each other. Therefore, like before, linear phase detector 204 receives the pilot frequency input signal and phase compares it with the injection frequency provided by node 404, which is in phase-quadrature with it. Thus, the output of linear phase detector 204 contains the base band control signal for providing an error correction signal to the voltage controlled oscillator. In contrast, the signal available at node 406 is provided in phase with the pilot frequency input and utilized by the automatic leveling circuit to be discussed shortly.

The automatic leveling circuit arrangement 410 includes linear multiplier 412 having an output which proceeds to comparator stage 414 having a predetermined reference voltage on node 416. The output from stage 414 is next integrated via stage 418 and provides a variable supply voltage via line 420 to variable gain amplifier 422 utilized for providing an automatic leveling control stage. Thus, the received pilot frequency input signal at 102 has its amplitude or level set within a predetermined range according to automatic level control circuit 410. This circuit 410 provides a leveled signal at node 424 which drives the linear multiplier used as a phase detector, stage 204, as well as the linear multiplier stage 412 utilized as a peak amplitude level detector. Each of these linear multipliers is required to have one linear port, much like a mixer. As previously mentioned above, a suitable device is available from Motorola as device No. MC1496. The advantage of using automatic leveling circuit arrangement 410 is that it automatically levels variations in the received pilot frequency signal level. Moreover, the reference voltage on port 416 provides a way in which to modify the loop gain. Thus, this reference voltage provides a convenient way to compensate the loop gain when changing from a very low pilot frequency, such as 60 KHz, to a very high pilot frequency, such as 564 KHz.

In summary, each of the above mentioned arrangements 200, 300, and 400 including the automatic leveling circuit 410, are able to accomplish synchronization of a reference signal based upon an inputted pilot frequency signal. These arrangements are able to be changed quickly from operating at one pilot frequency to another pilot frequency so as to maintain the same common reference frequency output with minimal hardware changes and without compromising the performance provided by such simplified arrangements. These arrangements also benefit from the phase detection process taking place at the pilot frequency. By virtue of the fact that the pilot frequency is higher than the reference frequency, these arrangements have the benefit of faster and more rapid phase-lock acquisition, due to the shorter time periods between zero-crossings of the inputted pilot frequency. This is in contrast with the time intervals between zero-crossings for the much lower reference frequency, as utilized in the known second arrangement discussed earlier. Thus, the above mentioned arrangements are able to overcome the limitations of the known prior art.

Although the several synchronization arrangements of the present invention fully disclose many of the attendant advantages, it is understood that various changes and modifications not depicted herein are apparent to those skilled in the art. Therefore, even though the form of the above-described invention is merely a preferred or exemplary embodiment given with practical alternates, further variations may be made in the form, construction, and arrangement of the parts without departing from the scope of the above invention.

I claim:

1. Synchronization apparatus for deriving a stable reference signal from a selected pilot frequency which is embedded among other signal information inputted thereto, the apparatus forming a loop comprising in combination:
   controlled oscillator means for generating an output signal whose frequency is a harmonic of the desired reference signal and proportional to a control signal applied thereto;
   programmable means for multiplying the frequency of said output signal by a given preset factor to generate an injection signal therefrom; and
   linear means for comparing the phase difference between the selected pilot frequency and said injection signal, thereby producing a control signal at baseband to rapidly phase-lock the controlled oscillator means to the selected pilot frequency in accordance with said given preset factor of said programmable means.

2. The apparatus according to claim 1, wherein said controlled oscillator means comprises a voltage controlled oscillator preceded by a loop filter.

3. The apparatus according to claim 1, wherein said controlled oscillator means operates at a frequency such as the first harmonic of the reference frequency.

4. The apparatus according to claim 1, wherein the desired reference signal frequency is approximately 4 Khz.

5. The apparatus according to claim 1, wherein said oscillator means operates at a higher harmonic of the reference frequency, such as at least the second, and wherein a fixed divider is interposed between said oscillator and said programmable means to provide a lower output frequency than that available from the oscillator.

6. The apparatus according to claim 5, wherein said oscillator means is a voltage controlled crystal oscillator and operates at a frequency such as 5.2 Mhz.

7. The apparatus according to claim 1, wherein said programmable means comprises a programmable frequency synthesizer, such as a phase lock loop, having a selectable preset factor to multiply the frequency applied thereto.

8. The apparatus according to claim 1, wherein said given preset factor is selectable to one of a plurality of factors, such as 15, 16, 77, .128, and 141, so as to derive the same reference frequency from a selected pilot frequency, such as 60, 64, 308, 512, and 564 KHz, respectively.

9. The apparatus according to claim 1, wherein said linear means comprises a linear multiplier having a dual differential transistor pair, such as an MC1496.

10. The apparatus according to claim 1, wherein said linear means includes a filter, such as a bandpass filter, at the selected pilot frequency inputted thereto.

11. Improved synchronization apparatus for deriving a stable reference signal from a selected pilot frequency which is embedded among other signal information inputted thereto, the apparatus forming a loop comprising in combination:
controlled oscillator means for generating an output signal whose frequency is a harmonic of the desired reference signal and proportional to a control signal applied thereto;
programmable means for multiplying the frequency of said output signal by a given preset factor to generate a first injection signal which is in phase quadrature with respect to the selected pilot frequency and also with respect to a second injection signal, both said first and second injection signals outputted therefrom;
means for leveling inputted signals to the loop according to a gain-control voltage applied thereto; and
linear means for comparing the phase difference between the selected pilot frequency and said first injection signal,
said means for leveling utilizing the second injection signal to generate a negative feedback signal so as to provide a gain-control voltage, thereby ensuring a nearly constant pilot frequency input level for said loop, while said linear means produces a control signal at baseband to rapidly phase-lock said oscillator means to the selected pilot frequency in accordance with said given preset factor.

12. The apparatus according to claim 11, wherein said controlled oscillator means comprises a voltage controlled oscillator preceded by a loop filter.

13. The apparatus according to claim 11, wherein said controlled oscillator means operates at a frequency such as the first harmonic of the reference frequency.

14. The apparatus according to claim 11, wherein the desired reference signal frequency is approximately 4 Khz.

15. The apparatus according to claim 11, wherein said oscillator means operates at a higher harmonic of the reference frequency, such as at least the second, and wherein a fixed divider is interposed between said oscillator and said programmable means to provide a lower output frequency than that available from the oscillator.

16. The apparatus according to claim 15, wherein said oscillator means is a voltage controlled crystal oscillator and operates at a frequency such a 5.2 Mhz.

17. The apparatus according to claim 11, wherein said programmable means comprises a programmable frequency synthesizer, such as a phase lock loop, having a selectable preset factor to multiply the frequency applied thereto.

18. The apparatus according to claim 11, wherein said given preset factor is selectable to one of a plurality of factors, such as 15, 16, 77, 128, and 141, so as to derive the same reference frequency from a selected pilot frequency, such as 60, 64, 308, 512, and 564 KHz, respectively.

19. The apparatus according to claim 11, wherein said means for leveling comprises in combination:
an amplifier whose gain varies in proportion to a supply signal applied thereto;
a linear multiplier connected to an output of said amplifier and generating a negative feedback signal therefrom; and
an integrator having a node for summing the negative feedback signal and the gain-control voltage to provide the supply signal to said amplifier, thereby effecting leveling of inputted signals to said apparatus.

20. The apparatus according to claim 11, wherein said linear means comprises a linear multiplier having a dual differential transistor pair, such as an MC1496.

21. The apparatus according to claim 11, wherein said linear means includes a filter, such as a bandpass filter, at the selected pilot frequency inputted thereto.

22. A method of deriving a stable reference signal from a selected pilot frequency which is embedded among other signal information inputted thereto, the method comprising the steps of:
generating an output signal harmonically related to the desired reference signal and proportional to a control signal;
multiplying the output signal by a given preset factor so as to generate an injection signal therefrom; and
comparing the phase difference between the selected pilot frequency and said injection signal in a linear manner, thereby producing a control signal at baseband to rapidly phase-lock the output signal to the selected pilot frequency in accordance with said given preset factor.

23. The method according to claim 22, wherein said step of generating an output signal includes generating and dividing a signal to provide an output signal.

24. In a synchronization apparatus for deriving a common reference frequency output signal from a received one of a plurality of predetermined pilot frequencies embedded among other signal information, an improved circuit arrangement for providing automatic leveling and rapid phase-lock capability comprising:

(a) first linear multiplying means for providing a quadrature phase detector at the pilot frequency input signal and outputting a baseband control signal therefrom;

(b) second linear multiplying means for providing an in-phase signal level detector and outputting a signal proportional to the amplitude of the pilot frequency input signal to control a variable gain stage; and (c) programmable multiplying means for providing the same frequency to said element (a) via a first injection signal which is in phase quadrature with respect to the received pilot frequency and also with respect to a second injection signal that is fed to said element (b) above, said circuit arrangement thereby permitting phase accrual at the received pilot frequency whose input level has already been controlled by said variable gain stage.

* * * * *